(12) United States Patent
Yamamoto

(10) Patent No.: US 7,399,192 B2
(45) Date of Patent: Jul. 15, 2008

(54) HIGH DENSITY FLEXIBLE WIRING BOARD

(75) Inventor: Eiji Yamamoto, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 11/700,777

(22) Filed: Feb. 1, 2007

(65) Prior Publication Data

US 2007/0178751 A1 Aug. 2, 2007

(30) Foreign Application Priority Data

Feb. 2, 2006 (JP) ............................. 2006-026124

(51) Int. Cl.
*H01R 13/15* (2006.01)
(52) U.S. Cl. .......................... 439/260; 439/495; 439/67
(58) Field of Classification Search ................. 439/260, 439/495, 67, 77
See application file for complete search history.

(56) References Cited

U.S. PATENT DOCUMENTS

| | | | | |
|---|---|---|---|---|
| 5,219,292 | A * | 6/1993 | Dickirson et al. | 439/67 |
| 5,236,372 | A * | 8/1993 | Yunoki et al. | 439/260 |
| 6,017,244 | A * | 1/2000 | Daane | 439/495 |
| 2004/0244193 | A1* | 12/2004 | Jung et al. | 29/854 |
| 2005/0176288 | A1* | 8/2005 | Ohsawa et al. | 439/495 |
| 2006/0110951 | A1* | 5/2006 | Mongold | 439/67 |
| 2006/0286858 | A1* | 12/2006 | Uchida et al. | 439/495 |
| 2007/0037440 | A1* | 2/2007 | Uchida et al. | 439/495 |

FOREIGN PATENT DOCUMENTS

| | | |
|---|---|---|
| JP | 64-16083 U | 1/1989 |
| JP | 7-11783 U | 2/1995 |
| JP | 2001-177206 A | 6/2001 |
| JP | 2003-059560 A | 2/2003 |
| JP | 2005-302575 A | 10/2005 |

* cited by examiner

*Primary Examiner*—Gary F. Paumen
(74) *Attorney, Agent, or Firm*—Crowell & Moring LLP

(57) ABSTRACT

A high density flexible wiring connection device comprises a flexible flat cable (FFC) having narrow-pitch conductors and a flat cable connector (FC connector) having a double-sided contact designed for narrow-pitch wiring and having upper and lower contact terminals. A supplementary wiring board having upper and lower wiring terminals is introduced to connect alternate ones and the other alternate ones of the narrow-pitch conductors of the FFC to alternate ones of the upper contact terminals and alternate ones of the lower contact terminals of the FC connector, respectively, thereby making the pitch of each of the upper and lower wiring terminals twice the narrow pitch of the FFC and the FC connector. The use of the supplementary wiring board to thus convert the wiring pitch makes it possible to prevent whiskers, even if formed on the contact terminals, from causing short-circuits between adjacent contact terminals and between adjacent wiring terminals.

5 Claims, 9 Drawing Sheets

HIGH DENSITY FLEXIBLE WIRING BOARD

BACKGROUND OF THE INVENTION

1. Field of the Invention

The present invention relates to a high density flexible wiring connection device using a high density flexible flat cable, such as flexible flat cable (hereafter referred to as FFC), including a flexible printed circuit board (hereafter referred to as FPC), which is capable of high-density wiring, and can be attached to and detachable from a socket-type flexible cable connector.

2. Description of the Related Art

There have been advances in size and weight reduction in electronic equipment such cellular phones, personal computers and thin displays. Many electronic components including wiring boards or connection devices used in such electronic equipment use copper or copper alloys as wiring materials. For electrically connecting the electronic components e.g. to other wiring boards or connection devices, connectors such as FPC connectors are often advantageously used because they allow easy size reduction and circuit connection. When such connectors are used for connection, copper wiring terminals are normally subjected to surface treatment by electrolytic plating of e.g. gold or a tin-lead alloy. However, they have problems in that the cost of the gold plating is high, while the plating treatment of a lead-containing alloy may cause lead to dissolve out to contaminate the environment so that lead-free alloys are desired. Thus, studies have been made on pure tin plating and on plating of tin alloys containing no lead.

However, when the pure tin plating or the plating of a tin alloy containing no lead is applied on a copper wiring terminal e.g. of a flexible board to be press-fit into an FPC connector so as to form a plated film on the copper wiring terminal, needle-like crystals called "whiskers" are rapidly formed on the plated film around portions thereof which are pressed by pins of the FPC connector. The whiskers are also formed on various surfaces such as a plated surface of a flexible board, a plated surface of the FPC connector, and a surface of a burr produced by inserting the flexible board into the FPC connector. All such whiskers are considered to be caused by the press-fit force which is generated between the flexible board and the FPC connector, pressing the flexible board from both sides, and which acts as external stresses to each other, i.e. to the flexible board and the FPC connector including the produced burr. The thus formed whiskers may cause short-circuits e.g. between copper wirings, causing failures e.g. in electronic equipment.

A conventional flexible wiring board or connection device uses a resin film to suppress the formation of whiskers to be caused by the press-fit with an FPC connector having pins. For example, assume that a copper wiring terminal of an FPC or an FFC electrolytically plated with pure tin or tin alloy is to be press-fit with a ZIF (Zero Insertion Force) type connector which requires only a small force. For this purpose, it is known to form a thin resin film layer in advance on a portion of the copper wiring terminal which portion is to be electrically connected to a pin of the ZIF type connector so as to suppress the formation of whiskers (refer to e.g. Japanese Laid-open Patent Publication 2005-302575). However, this technology requires that the thin resin film layer be formed with high accuracy on the FPC or FFC copper wiring terminal. Furthermore, there is a risk that the contact resistance of the formed resin film layer to the pin of the ZIF type connector may change and increase due to variations in thickness of the resin film layer. In addition, it is difficult to suppress whiskers formed by repetitive use.

An example of a conventional flexible connector has an insulating sheet with pin contact arrays formed of flexible conductive plates bonded on both sides of the insulating sheet so as to form a dense three-layer structure (refer to e.g. Japanese Laid-open Utility Model Publication Hei 7-11783). Another example of a conventional flexible connector uses an FPC with a base film having a portion which corresponds to the connector, and on the upper and lower surfaces of which connector wirings are formed to be close and parallel to each other so as to form dense electrode arrays (refer to e.g. Japanese Laid-open Utility Model Publication Sho 64-16083).

Yet another example of a conventional flexible connector uses an FPC with a film-based contact portion having two sets of parallel land portions formed thereon as well as lead patters provided on the upper and lower surfaces thereof and connected to the land portions in order to form a flexible board with dense electrode arrays to be used for connector interconnection (refer to e.g. Japanese Laid-open Patent Publication 2001-177206). Also known is a connector to be connected to a flexible wiring board or connection device, in which the connector uses an FPC with an insulating film base having lead patterns printed on upper and lower surfaces thereof to increase the number and density of contacts (refer to e.g. Japanese Laid-open Patent Publication 2003-59560). However, all of these conventional flexible cables or wiring boards or connection devices are aimed at increasing the number and density of contact electrodes, so that they are likely to be affected by whiskers which may cause short-circuits.

SUMMARY OF THE INVENTION

An object of the present invention is to provide a high density flexible wiring connection device which can eliminate the affect of whiskers, particularly to prevent short-circuits.

This object is achieved according to the present invention by a high density flexible wiring connection device comprising: a flexible flat cable having narrow-pitch parallel conductors; a flat cable connector having a double-sided contact designed for narrow-pitch wiring and having upper and lower contact terminals to be electrically connected to the narrow-pitch conductors of the flexible flat cable; and a supplementary wiring board having upper wiring terminals and lower wiring terminals provided on upper and lower surfaces thereof for connecting the flexible flat cable and the flat cable connector, such that one ends of the upper wiring terminals of the supplementary wiring board are connected to alternate ones of the narrow-pitch conductors, and one ends of the lower wiring terminals of the supplementary wiring board are connected to the other alternate ones of the narrow-pitch conductors, while the other ends of the upper wiring terminals of the supplementary wiring board are connected to alternate ones of the upper contact terminals of the flat cable connector, and the other ends of the lower wiring terminals of the supplementary wiring board are connected to alternate ones of the lower contact terminals of the flat cable connector, whereby the upper wiring terminals as well as the lower wiring terminals of the supplementary wiring board have a wide pitch twice as large as the narrow pitch of the narrow-pitch conductors, thereby preventing whiskers from causing short-circuits between adjacent ones of the upper contact terminals and between adjacent ones of the lower contact terminals of the flat cable connector.

According to the present invention, wide-pitch wiring terminals having a pitch twice as large as the narrow pitch of the narrow-pitch conductors of the flexible flat cable can be provided on the supplementary wiring board which is contiguous or connected as an extension to the flexible flat cable. Thus, it is possible to easily prevent whiskers from causing short-circuits between adjacent contact terminals and between adjacent wiring terminals with simple structure of the high density flexible wiring connection device. Furthermore, when required, it is also possible to provide the flexible flat cable integrally with the supplementary wiring board, thereby further enabling the manufacture of the high density flexible wiring connection device in a small size and at a low cost.

Preferably, the alternate ones of the narrow-pitch conductors are provided at the wide pitch twice as large as the narrow pitch on and over entire length of the upper surface of the flexible flat cable, and are contiguous to the upper wiring terminals provided at the wide pitch twice as large as the narrow pitch on and over entire length of the upper surface of the supplementary wiring board, while the other alternate ones of the narrow-pitch conductors are provided at the wide pitch twice as large as the narrow pitch on and over entire length of the lower surface of the flexible flat cable, and are contiguous to the lower wiring terminals provided at the wide pitch twice as large as the narrow pitch on and over entire length of the lower surface of the supplementary wiring board, such that the alternate ones of the narrow-pitch conductors and the upper wiring terminals are staggered and alternately intervened with respect to the other alternate ones of the narrow-pitch conductors and the lower wiring terminals, respectively.

In the high density flexible wiring connection device according to this preferred mode, all the conductors and wiring terminals on the upper surface thereof as well as all the conductors and wiring terminals on the lower surface thereof have the wide pitch on and over the entire length thereof on both the flexible flat cable and the supplementary wiring board. Thus, it is not necessary to convert the pitch of the conductors on the flexible flat cable to a wider pitch, so that the wide-pitch wiring terminals as contiguous portions of the wide-pitch conductors, as is, can be connected to the flat cable connector. This makes it possible to further easily prevent whiskers from causing short-circuits between adjacent contact terminals and between adjacent wiring terminals with simple structure of the high density flexible wiring connection device.

Still further preferably, all the narrow-pitch conductors of the flexible flat cable are formed at the narrow pitch on a flat plane in the supplementary wiring board. Since the supplementary wiring board can thereby be prepared separately from the flexible flat cable, it is possible to facilitate and increase the degree of freedom of the design of the supplementary wiring board. Since the prevention of the affect of whiskers in electrically connecting the flexible flat cable and the flat cable connector can be achieved by designing the supplementary wiring board without requiring a change in the design of the flexible flat cable, it is possible to use a flexible flat cable with a conventional design for electrical connection.

Yet further preferably, adjacent ones of the contact terminals has a gap distance larger than 0.15 mm. This makes it possible to prevent whiskers from causing short-circuits between adjacent contact terminals and between adjacent wiring terminals with simple structure of the high density flexible wiring connection device.

In the high density flexible wiring connection device, the narrow pitch of the contact terminals of the flat cable connector can be 0.5 mm. This is advantageous because a flexible wiring connection device which uses 0.5 mm as the narrow pitch of the contact terminals of the flat cable connector can be easily prepared, making it possible to easily prevent whiskers from causing short-circuits between adjacent contact terminals and between adjacent wiring terminals.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein.

DESCRIPTION OF THE PREFERRED EMBODIMENTS

Figure 1:
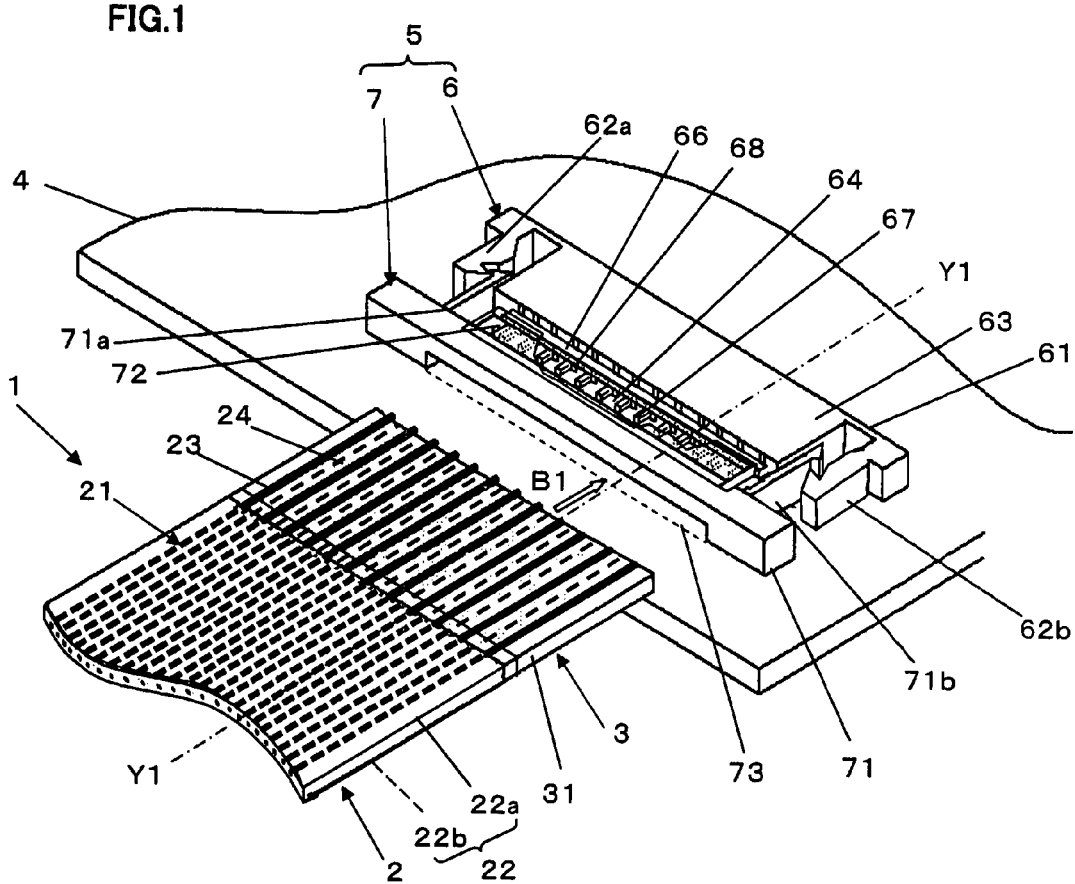
FIG. 1 is a schematic perspective view of a high density flexible wiring connection device according to a first embodiment of the present invention to be inserted into a flat cable connector.
Figure 2:
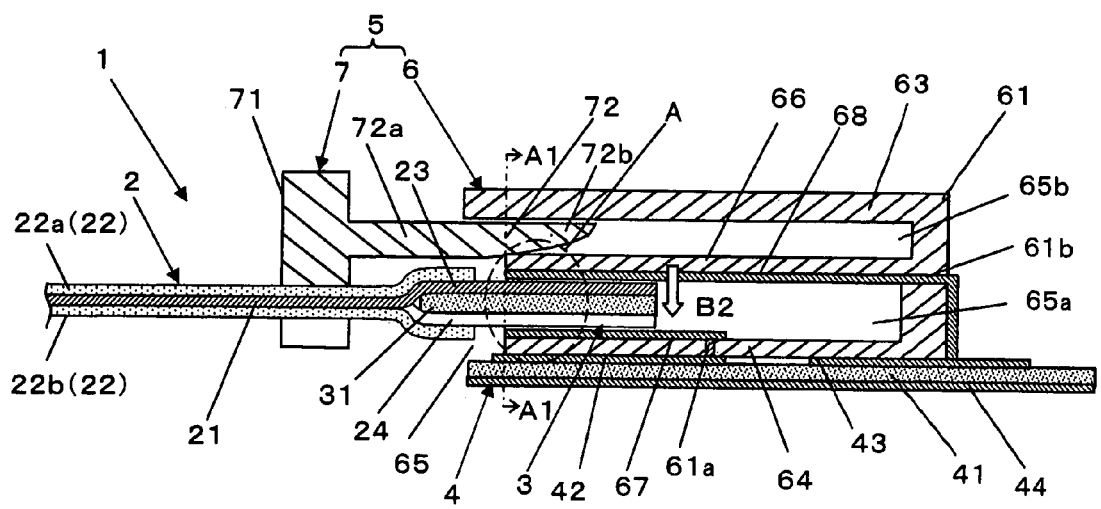
FIG. 2 is a schematic cross-sectional view of the flexible wiring connection device inserted into the flat cable connector along line Y1-Y1 of FIG. 1.

Embodiments of the present invention, as the best mode for carrying out the invention, will be described hereinafter with reference to the annexed drawings. It is to be understood that the embodiments described herein are not intended as limiting, or encompassing the entire scope of, the invention. Note that like parts are designated by like reference numerals or reference characters throughout the drawings. Referring to FIG. 1 to FIG. 6, a high density flexible wiring connection device 1 according to a first embodiment of the present invention will be described. FIG. 1 is a schematic perspective view of a high density flexible wiring connection device 1 according to a first embodiment of the present invention to be inserted into a flat cable connector 5, while FIG. 2 is a schematic cross-sectional view of the flexible wiring connection device. 1 inserted into the flat cable connector 5 along line Y1-Y1 of FIG. 1.

The high density flexible wiring connection device 1 according to the present embodiment comprises: a flexible flat cable (hereafter referred to as FFC) 2 (which can be a flexible printed circuit board or FPC), having narrow-pitch parallel conductors 21 formed at a narrow pitch of 0.5 nm on a flat plane in an insulating resin cover 22; and a flexible supplementary wiring board 3 connected to the FFC 2 and having parallel wiring terminals 23, 24 (as extensions of the narrow-pitch conductors 21 of the FFC 2) formed on flat upper and lower surfaces of a flexible insulating resin plate 31, respectively. In the present specification, the term "supplementary wiring board" is used to mean any member functioning equivalently, and thus includes e.g. a contact member 2a as will be described later.

The supplementary wiring board 3 is connected to a flat cable connector (hereafter referred to as FC connector) 5 having a double-sided contact designed for narrow-pitch wiring, such that the wiring terminals 23, 24 of the supplementary wiring board 3 (hence the narrow-pitch conductors 21 of the FFC 2) are connected to contact terminals 68, 67 of the FC connector 5. In the FFC 2, the narrow-pitch conductors 21 are placed in the insulating resin cover 22, such that adjacent ones of the conductors 21 are spaced from each other at a predetermined distance so as to be insulated from each other. The insulating resin cover 22 has upper and lower flexible insulating resin cover halves 22a, 22b to firmly sandwich the conductors 21, thereby forming the FFC 2. The insulating resin cover 22 has a thickness of 1.0 mm or smaller so as to allow the FFC 2 to have flexibility.

In the flexible supplementary wiring board 3, the wiring terminals 23, 24 (as extensions of the conductors 21 of the FFC 2) are alternately placed on the upper and lower surfaces of the insulating resin plate 31, respectively. Thus, in the set of wiring terminals 23 on the upper surface as well as in the set of wiring terminals 24 on the lower surface of the insulating resin plate 31, the center-to-center distance between adjacent wiring terminals 23 as Well as that between adjacent wiring terminals 24 is twice as large as that (d1 shown in FIG. 3B) between adjacent conductors 21 of the FFC 2. As apparent from the above description, the wiring terminals 23, 24 are conductors extended from the narrow-pitch conductors 21 of the FFC 2, respectively, so that the conductors 21 are integral with the wiring terminals 23, 24, respectively. Accordingly, the combination of the FFC 2 and the supplementary wiring board 3 does not cause discontinuity in the electrical conductor paths therein which may occur when separate cables or wiring boards are connected for wiring. Thus, it is possible to smoothly transmit electrical signals between the FFC 2 and the supplementary wiring board 3.

The FC connector 5 to be connected to the supplementary wiring board 3 (and hence the FFC 2) has a ZIF (Zero Insertion Force) structure which is suitable for the flexible supplementary wiring board 3. When connecting the supplementary wiring board 3 to the FC connector 5, this ZIF structure makes it possible to insert the supplementary wiring board 3 into the FC connector 5 with a low insertion force without exerting contact pressure on the supplementary wiring board 3. After the supplementary wiring board 3 is inserted into the FC connector 5, the ZIF structure allows the wiring terminals 23, 24 of the supplementary wiring board 3 to be connected to the contact terminals of the FC connector 5 with a predetermined contact pressure, enabling stable electrical connection between the supplementary wiring board 3 and the FC connector 5.

Referring to FIG. 1 and FIG. 2, the FC connector 5 comprises: an insulating housing 6 mounted on a printed circuit board 4 having a dielectric plate 41 with wiring conductors 42, 43 and a grounding conductor 44 formed on upper and lower surfaces thereof; and a slider 7 detachably attached to the insulating housing 6. The insulating housing 6 is formed of an insulating plastic resin having a roughly elongated parallelepiped shape, and having a housing body 61 and engagement members 62a, 62b which have engagement hooks to engage with engagement hooks 71a, 71b of the slider 7, respectively. The housing body 61 has an upper wall 63 and a lower wall 64 which define an insertion space with an opening 65 at an end thereof.

This insertion space with the opening 65 is divided into a lower insertion space 65a and an upper insertion space 65b by a movable or pivotable insulating plate 66 of the housing body 61 which is positioned in the middle between, and substantially parallel to, the upper and lower walls 63, 64. Each of the lower and upper insertion spaces 65a, 65b has an opening (portion of the opening 65) in the form of an elongated slit or slot having a width and a height. The movable insulating plate 66 is formed of a thin insulating plate having a fixed end at an end thereof integrally fixed to an end wall of the housing body 61, and a free end at an opposite end thereof on the side of the opening 65, such that the free end can pivot about the fixed end to move vertically, i.e. move in the height direction or direction perpendicular to the width of the opening 65, more specifically perpendicular to the horizontal direction and to arrow B1 in FIG. 1.

The supplementary wiring board 3 connected to the FFC 2 is inserted into the lower insertion space 65a, and a pressure plate 72 of the slider 7 is inserted into the, upper insertion space 65b. The FC connector 5 further comprises contact terminals 67, 68 which serve as opposite contacts of the FC connector 5 to be vertically aligned with each other, and which are provided on mutually facing upper surface of the lower wall 64 and lower surface of the movable insulating plate 66, respectively. More specifically, the contact terminals 67 on the upper surface of the lower wall 64 are parallel to each other at a pitch of 0.5 mm and vertically aligned with the contact terminals 68 on the lower surface of the insulating plate 66, respectively, which are also parallel to each other at a pitch of 0.5 mm.

Thus, the FC connector 5 serves as a connector having a double-sided contact designed for narrow-pitch wiring, and allows the wiring terminals 23, 24 of the flexible wiring connection device 1 to contact the contact terminals 68, 67 on both facing sides or surfaces in the lower insertion space 65a. The contact terminals 68, 67 to contact the wiring terminals 23, 24 of the supplementary wiring board 3, when inserted into the lower insertion space 65a, are connected to the wiring conductors 42, 43 of the printed circuit board 4 via through-holes 61a, 61b, which penetrate the housing body 61, so as to be electrically connected to other connection wirings, conductors or circuits. The slider 7 will be described in more detail below.

In FIG. 1, the slider 7 is partially removed or cut away to show the insulating plate 66 and the contact terminals 68, 67. The slider 7 has: a slider body 71; a pressure plate 72 horizontally projecting forward from the slider body 17 (in the direction of arrow B1 in FIG. 1); and engagement hooks 71a, 71b to engage with the engagement members 62a, 62b provided on the sides of the housing body 61. The insulating housing 6 and the slider 7 are firmly connected to each other by the engagement between the engagement hooks 71a, 71b of the slider 7 and the engagement members 62a, 62b of the insulating housing 6. In order to allow the pressure plate 72 to be inserted into the upper insertion space 65b of the housing body 61, the pressure plate 72 has a width (in the horizontal direction perpendicular to arrow B1) approximately equal to, but slightly smaller than, the width of the upper insertion space 65b.

The pressure plate 72 has a proximal portion 72a connected to the slider body 71 and a tapered end portion 72b which decreases in thickness from the proximal portion 72a toward a free end thereof (in the direction of arrow B1 in FIG. 1) to facilitate insertion of the pressure plate 72 into the upper insertion space 65b in the direction of arrow B1 in FIG. 1, i.e. in the rightward direction in FIG. 2. The proximal portion 72a of the pressure plate 72 connected to the slider body 71 has a thickness to press the movable insulating plate 66 downward when the pressure plate 72 is inserted into the upper insertion space 65b, so as to secure contact between the wiring terminals 23, 24 and the contact terminals 68, 67.

More specifically, the thickness of the proximal portion 72a of the pressure plate 72 is designed to be slightly larger than the sum of the height of the opening of the upper insertion space 65b (i.e. distance between the upper wall 63 and the movable insulating plate 66) plus the height of an upper gap in the lower insertion space 65a between the lower surface of the movable insulating plate 66 (or contact terminals 68) and the upper surface of the supplementary wiring board 3 (or wiring terminals 23) and plus the height of a lower gap in the lower insertion space 65a between the lower surface of the supplementary wiring board 3 (or wiring terminals 24) and the upper surface of the lower wall 64 (or contact terminals 67), when the supplementary wiring board 3 is inserted into the lower insertion space 65a.

Because of the slightly larger thickness of the proximal portion 72a of the pressure plate 72, the pressure plate 72 (more specifically the proximal portion 72a), when inserted into the upper insertion space 65b, is press-fit between the upper wall 63 and the movable insulating plate 66 so as to be press-inserted into the upper insertion space 65b. Thus, when the pressure plate 72 is inserted into the upper insertion space 65b, the flexible movable insulating plate 66 is pressed down toward the lower wall 64, whereby the wiring terminals 23 on the upper surface of the insulating resin plate 31 and the wiring terminals 24 on the lower surface of the insulating resin plate 31 are pressed (press-contacted) to the contact terminals 68 on the lower surface of the movable insulating plate 66 and the contact terminals 67 on the upper surface of the lower wall 64 of the housing body 61.

Referring to FIG. 2 together with FIG. 1, the process of connecting the FC connector 5 to the FFC 2 (high density flexible wiring connection device 1) is started by first inserting the supplementary wiring board 3 of the FFC 2 into the lower insertion space 65a of the insulating housing 6 through a gap 73 between the printed circuit board 4 and the slider body 71 of the slider 7 in the FC connector 5. Since the FC connector 5 has a ZIF structure, the lower insertion space 65a has a space with a sufficient opening. Accordingly, the FFC 2 or the supplementary wiring board 3 can be inserted therein with a low insertion force without exerting contact pressure on the supplementary wiring board 3, thereby bringing the wiring terminals 23, 24 into substantial contact with the contact terminals 68, 67.

Thereafter, the pressure plate 72 of the slider 7 is inserted into the lower insertion space 65a of the insulating housing 6 so as to engage the engagement members 62a, 62b on both sides of the insulating housing 6 with the engagement hooks 71a, 71b on both sides of the slider 7, whereby the pressure plate 72 is inserted to a considerable depth in the lower insertion space 65b, and the insulating housing 6 is firmly connected to the slider 7. Thus, the movable insulating plate 66 is pressed down toward the lower wall 64 (in the direction of arrow B2 in FIG. 2) so as to press-contact the wiring terminals 23, 24 to the contact terminals 68 of the movable insulating plate 66 and the contact terminals 67 of the lower wall 64 of the housing body 61, thereby establishing firm contact therebetween, as will be described in detail later with reference to FIG. 3A and FIG. 3B.

Figure 4:
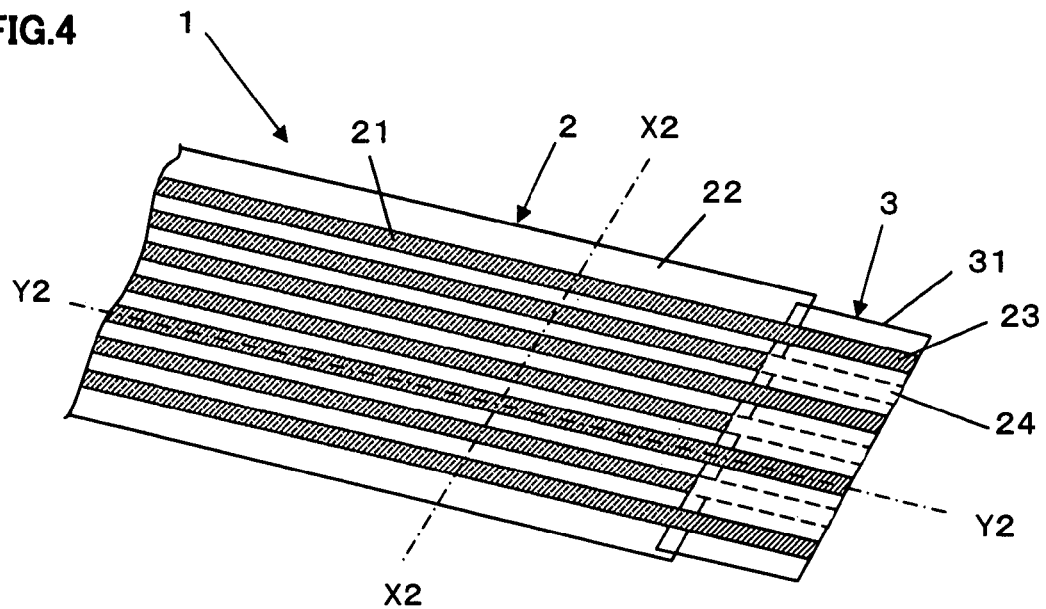
FIG. 4 is a schematic perspective view of an upper surface of a portion of the flexible wiring connection device which is a connecting portion between a supplementary wiring board and a flexible flat cable.
Figure 5A:
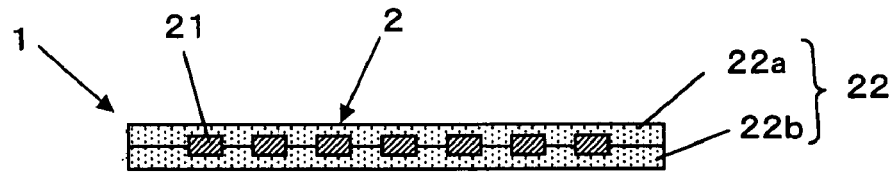
FIG. 5A and FIG. 5B are schematic cross-sectional views of the flexible wiring connection device along line X2-X2 and line Y2-Y2 of FIG. 4, respectively.
Figure 5B:
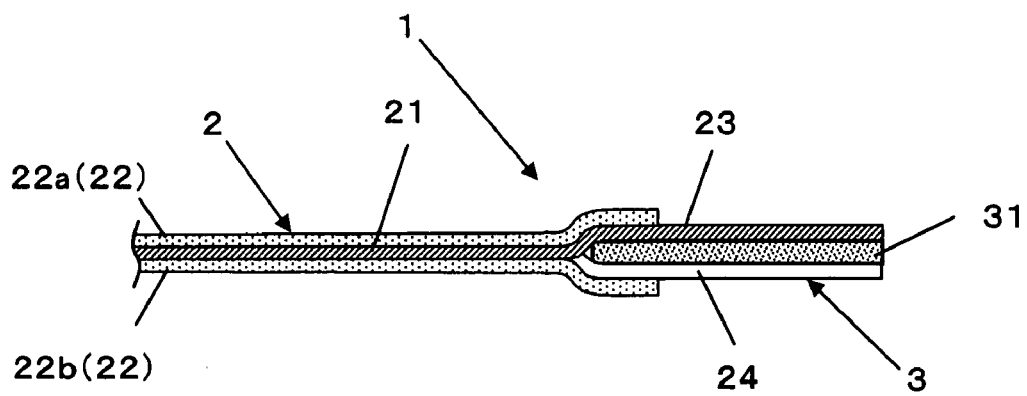

Next, referring to FIG. 4, FIG. 5A, FIG. 5B and FIG. 6, the high density flexible wiring connection device 1 according to the first embodiment, particularly the relationship between the supplementary wiring board 3 and the FFC 2, will be described in detail. FIG. 4 is a schematic perspective view of an upper surface of a portion of the flexible wiring connection device 1, which is a connecting portion between the supplementary wiring board 3 and the FFC 2. FIG. 5A and FIG. 5B are schematic cross-sectional views of the flexible wiring connection device 1 along line X2-X2 and line Y2-Y2 of FIG. 4, respectively, while FIG. 6 is a schematic top plan view of the connecting portion as shown in FIG. 4.

As shown in FIG. 4, FIG. 5A, FIG. 5B and FIG. 6 together with the preceding drawings, the flexible supplementary wiring board 3, which is to be electrically connected to the contact terminals 68, 67 of the insulating housing 6, has the narrow-pitch conductors 21 alternately bent oppositely (i.e. upward and downward) and placed on the upper and lower surfaces of the insulating resin plate 31 thereof, respectively. Thereby, the extensions or portions of the conductors 21 on the upper and lower surface of the insulating resin plate 31 become or serve as the set of wiring terminals 23 and set of wiring conductors 24, respectively. Accordingly, assuming that the narrow-pitch conductors 21 have an inter-conductor distance d1 (i.e. center-to-center distance between adjacent conductors 21 or pitch of conductors 21) of 0.5 mm, each of the set of wiring terminals 23 and set of wiring terminals 24 in the supplementary wiring board 3 has an inter-terminal distance d5 (i.e. center-to-center distance between adjacent wiring terminals 23 and between adjacent wiring terminals 24 or pitch of wiring terminals 23, 24) of 1.0 mm. This inter-terminal distance d5 is twice as large as the inter-conductor distance d1. Thus, the set of wiring terminals 23 and set of wiring terminals 24 of the supplementary wiring board 3 can be referred to as wide-pitch wiring terminals. This will be described in more detail below with reference to FIG. 3A and FIG. 3B together with FIG. 6.

Figure 3A:
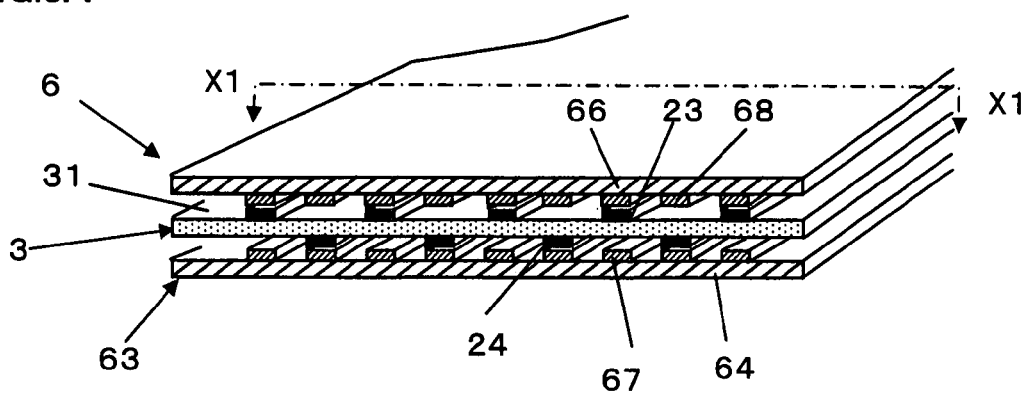
FIG. 3A is a schematic perspective view of portion A indicated by dashed circle, including a cross-sectional view along line A1-A1 in FIG. 2.
Figure 3B:
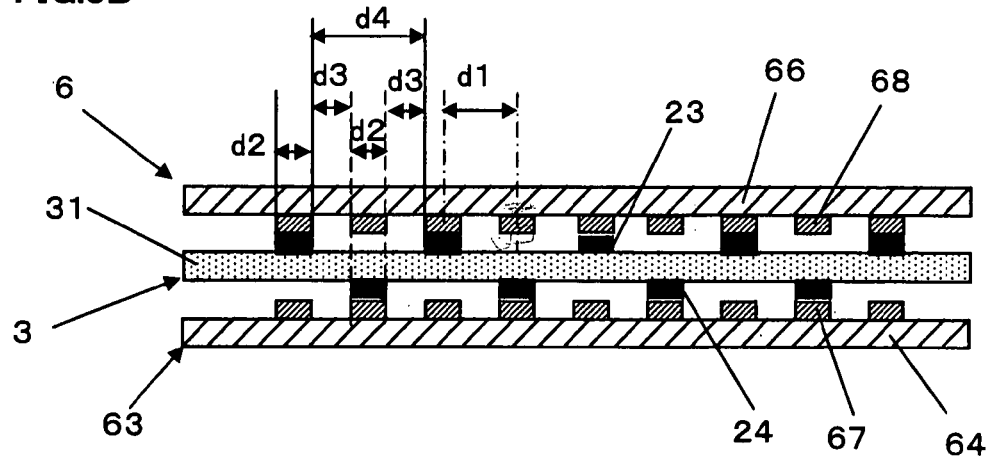
FIG. 3B is a schematic cross-sectional view along line X1-X1 in FIG. 3A.

FIG. 3A is a schematic perspective view of portion A indicated by a dashed circle and including a cross-sectional view along line A1-A1 in FIG. 2, while FIG. 3B is a schematic cross-sectional view along line X1-X1 in FIG. 3A. As shown in FIG. 3A, in the insulating housing 6, the wide-pitch wiring terminals 23 on the upper surface of the insulating resin plate 31 are positioned at positions of, and thereby contact, alternate contact terminals (every other contact terminal) 68 of the movable insulating plate 66, while the wide-pitch wiring terminals 24 on the lower surface of the insulating resin plate 31 are positioned at positions of, and thereby contact, alternate contact terminals (every other contact terminal) 67 of the lower wall 64.

Figure 6:
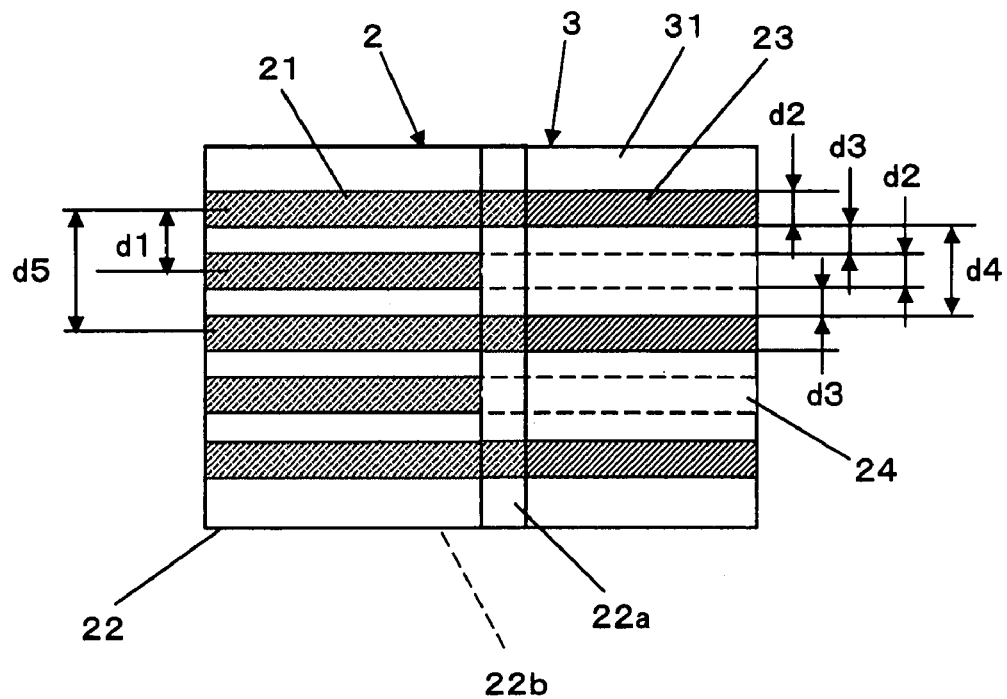
FIG. 6 is a schematic top plan view of the connecting portion as shown in FIG. 4.

Referring to FIG. 6 and FIG. 3B, assume that each of the narrow-pitch conductors 21 as well as each of the wide-pitch wiring terminals 23, 24) has a width d2 of 0.3 mm. Under this assumption, the narrow-pitch conductors 21, and hence the contact terminals 68, 67, have a gap distance d3 (i.e. distance between adjacent facing sides of adjacent conductors 21 and between adjacent facing sides of adjacent contact terminals 68, 67) of 0.2 mm. Despite the narrow gap distance d3 between adjacent conductors 21 and hence between adjacent contact terminals 68, 67, each of the set of wide-pitch wiring terminals 23 and set of wide-pitch wiring terminals 24 consequently has a gap distance d4 (i.e. distance between adjacent facing sides of adjacent wiring terminals 23 and between adjacent facing sides of adjacent wiring terminals 24) of 0.7 mm. Thus, the wide gap distance d4 of 0.7 mm is more than twice as large as the narrow gap distance d3 of 0.2 mm. Note here that the width (d2) of each of the conductors 21 (each of the wiring terminals 23, 24) is not required to be exactly the same as the width (d2) of each of the contact terminals 68, 67. It is sufficient if these widths are approximately the same.

As described above, the wiring terminals 23, 24 provided on the upper and lower surfaces of the supplementary wiring board 3 (more specifically insulating resin plate 31) have an inter-terminal distance d5 of a wide pitch which is twice as large as an inter-conductor distance d1 of a narrow pitch which the conductor terminals 68, 67 have. Accordingly, as shown in FIG. 3B, the wiring terminals 23, 24 contact alternate ones of the conductor terminals 68, 67, respectively. In other words, the supplementary wiring board 3 contacts the FC connector 5 at a wide-pitch inter-terminal distance d5 (d5=2d1).

Thus, the electrical connection between the narrow-pitch FFC 2 and the narrow-pitch FC connector 5 is made by the contact between the wiring terminals 23, 24 having a wide-pitch inter-terminal distance d5 (1.0 mm here) and the contact terminals 68, 67 having a narrow-pitch inter-conductor distance d1 (0.5 mm here). This virtually converts the wiring connection using the FFC 2 having the narrow-pitch conductors with the inter-conductor distance of d1 to the wide-pitch wiring connection using the wiring terminals 23, 24 having the wide-pitch terminals with the inter-terminal distance of d5, which is twice as large as d1. This solves the problem of whiskers for the reasons described below.

It is known that whiskers are formed and grow to have a length of maximum about 0.15 mm. Thus, even if whiskers are formed and grow at the connection between the supplementary wiring board 3 and FC connector 5 (at the connection between each of the contact terminals 68, 67 and each of the wiring terminals 23, 24 press-contacted to the each of the contact terminals 68, 67), there is still an allowance of at least 0.4 mm in the gap distance between adjacent ones of the set of wide-pitch wiring terminals 23 and the set of wide-pitch wiring terminals 24, thereby preventing short-circuits. This is because each of the set of wiring terminals 23 and set of wiring terminals 24 has a gap distance d4 of 0.7 mm whereas the maximum possible total length of whiskers in each space between the adjacent wiring terminals 23, 24 is 0.3 mm, which is a sum of maximum possible lengths (0.15 mm each) of whiskers formed on both adjacent facing sides of the adjacent wiring terminals 23, 24 in the each space.

In this way, the wiring terminals 23, 24 on both upper and lower surfaces of the supplementary wiring board 3 make it possible to substantially completely prevent short-circuits between themselves which may be caused by whiskers formed to grow between the wiring terminals 23, 24 and the FC connector 5. Furthermore, in the FC connector 5, only alternate ones (every other one) of the narrow-pitch contact terminals 68, 67 contact the wiring terminals 23, 24 of the supplementary wiring board 3. Those contact terminals 68, 67, which do not contact the wiring terminals 23, 24 and thus do not receive external stresses, do not form whiskers, so that any two adjacent ones of the contact terminals 68, 67 do not consecutively form whiskers. That is, only one of two adjacent contact terminals 68, 67 may cause formation of whiskers, while the other may not. Thus, even if whiskers having a length of maximum 0.15 mm may be formed on the contact terminals 68, 67 which contact the wiring terminals 23, 24, any two adjacent ones of the contact terminals 68, 67 can be prevented from short-circuiting to each other, because the contact terminals 68, 67 have a gap distance of 0.2 mm.

As described in the foregoing, the high density flexible wiring connection device 1 according to the present embodiment uses an FFC 2 which has narrow-pitch conductors 21 provided at a pitch of 0.5 mm, for example, and which is provided with a flexible supplementary wiring board 3 at a portion to be connected to contact terminals 68, 67 of an FC connector 5. The narrow-pitch conductors 21 are alternately extended to become a set of wide-pitch wiring terminals 23 and a set of wide-pitch wiring terminals 24 placed on upper and lower surfaces of the supplementary wiring board 3 (flexible insulating resin plate 31), respectively. Thereby, the inter-terminal distance (pitch) d5 between the wiring terminals 23 on the upper surface and between the wiring terminals 24 on the lower surface of the supplementary wiring board 3 can be made twice as large as the inter-conductor distance (pitch) d1 between the narrow-pitch conductors 21.

This high density flexible wiring connection device 1 makes it possible to easily prevent whiskers from causing short-circuits between adjacent contact terminals 68 and between adjacent contact terminals 67 as well as short-circuits between adjacent wiring terminals 23 and between adjacent wiring terminals 24, even if the whiskers are formed on alternate contact terminals 68 and alternate contact terminals 67 which are press-contacted to the wiring terminals 23 and wiring terminals 24, respectively, as long as the gap distance d3 between adjacent facing sides of adjacent contact terminals 68, 67 is larger than 0.15 mm that is a maximum length of whiskers, if any, formed to grow on the contact terminals 68, 67. Since this high density flexible wiring connection device 1 does not require any special chemical treatment to prevent the affect of whiskers or prevent whiskers from causing short-circuits, it can be manufactured by a simple process and does not cause an environmental problem due to chemical treatment.

Note that in the process of providing the supplementary wiring board 3 with wiring terminals 23, 24 from an FFC 2, it is also possible to first place the wiring terminals 23, 24 on upper and lower surfaces of the supplementary wiring board 3, and then to form the FFC 2 using upper and lower flexible insulating resin cover halves 22a, 22b. Also note that although the foregoing has described a high density flexible wiring connection device 1 using an FC connector 2, it is also possible for the high density flexible wiring connection device 1 to use a flexible printed circuit board (which can be referred to as FPC). Thus, in the present specification, the term "flexible flat cable" includes an FPC. This also applies to embodiments described later.

Figure 7:
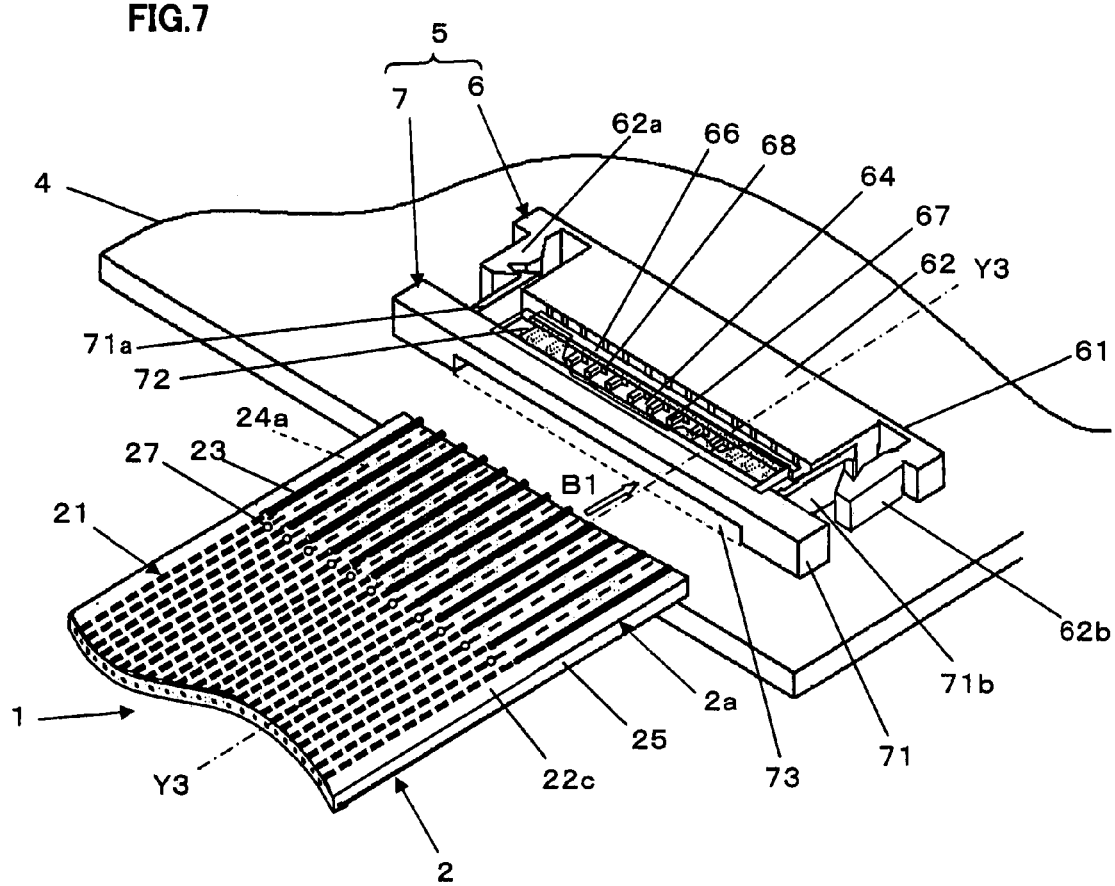
FIG. 7 is a schematic perspective view of a high density flexible wiring connection device according to a second embodiment of the present invention to be inserted into a flat cable connector.
Figure 8:
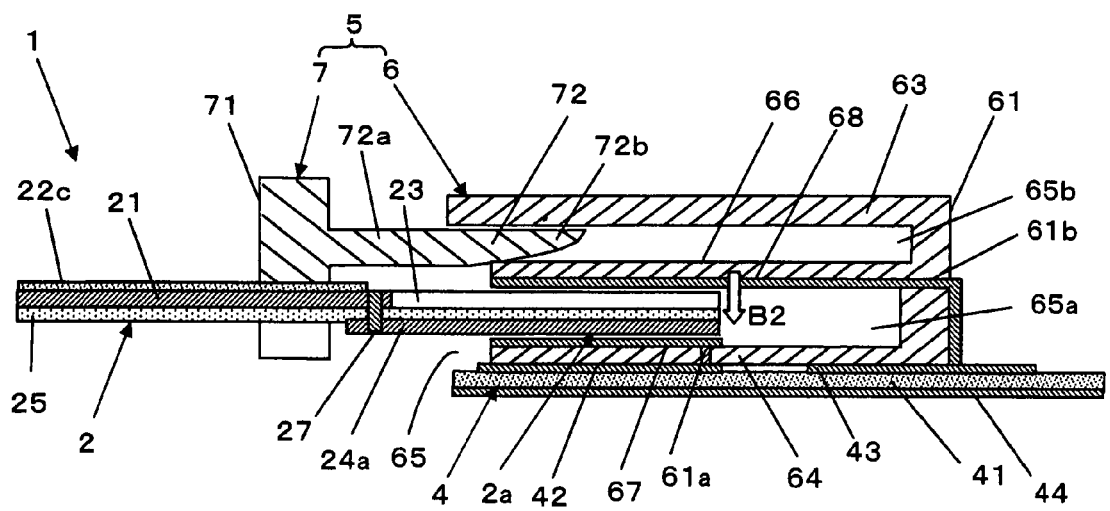
FIG. 8 is a schematic cross-sectional view of the flexible wiring connection device along line Y3-Y3 of FIG. 7.
Figure 9A:
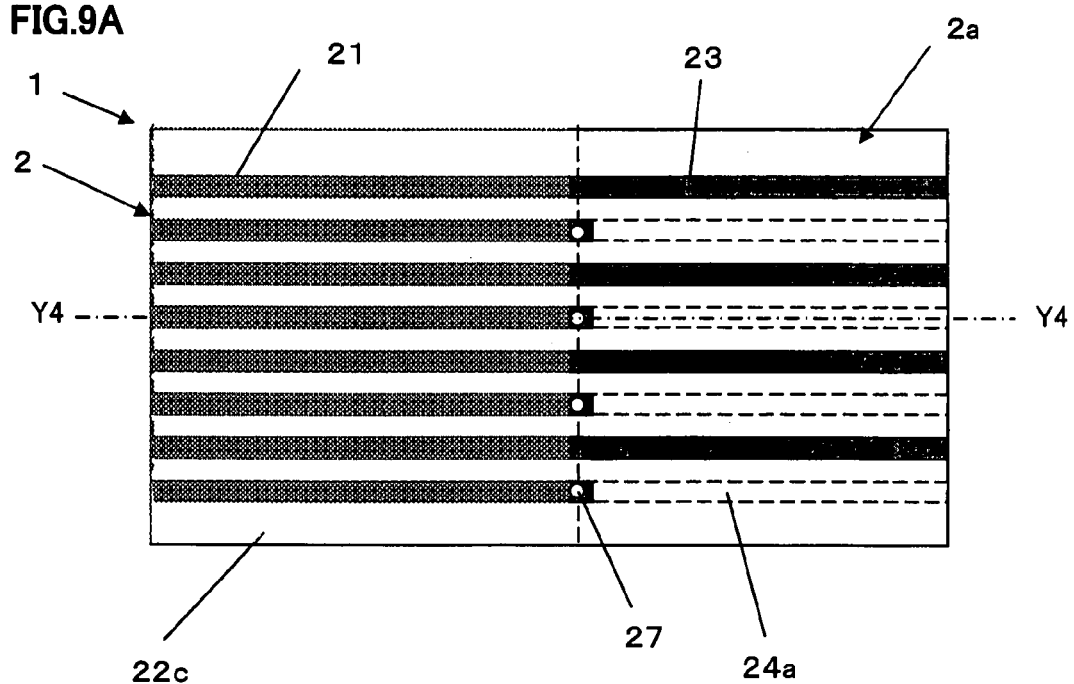
FIG. 9A is a schematic top plan view of an upper surface of a portion of the flexible wiring connection device which is a connecting portion between a contact member and a flexible flat cable.
Figure 9B:
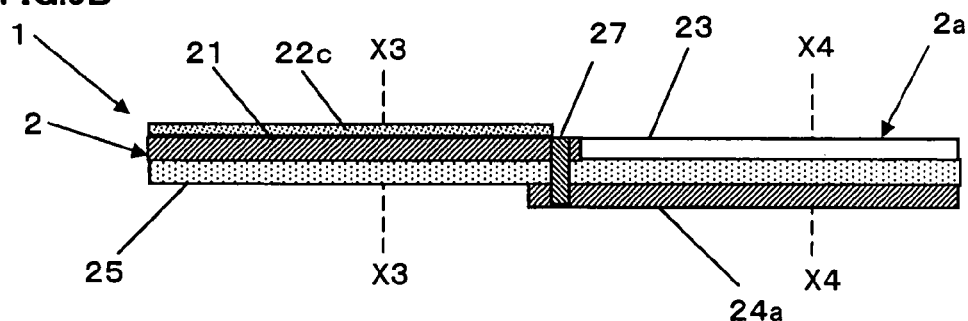
FIG. 9B is a schematic cross-sectional view of the portion of FIG. 9A along line Y4-Y4 of FIG. 9A.
Figure 9C:
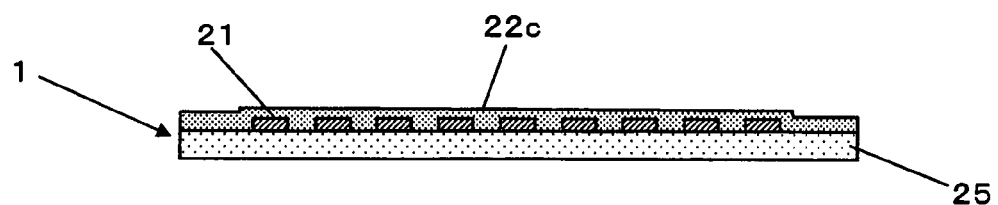
FIG. 9C and FIG. 9D are schematic cross-sectional views of the portion of FIG. 9B along line X3-X3 and line X4-X4 of FIG. 9B, respectively.
Figure 9D:
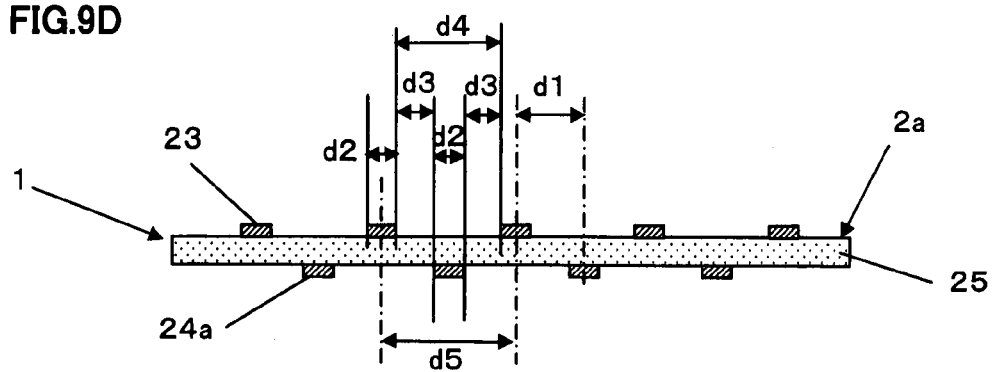

Referring now to FIG. 7, FIG. 8 and FIG. 9A to 9D, a high density flexible wiring connection device 1 according to a second embodiment of the present invention will be described. FIG. 7 is a schematic perspective view of a high density flexible wiring connection device 1 according to the second embodiment to be inserted into a flat cable connector (hereafter referred to as FC connector) 5, while FIG. 8 is a schematic cross-sectional view of the flexible wiring connection device 1 along line Y3-Y3 of FIG. 7. FIG. 9A is a schematic top plan view of an upper surface of a portion of the flexible wiring connection device 1, which is a connecting portion between a contact member 2a and a flexible flat cable (hereafter referred to as FFC) 2, and FIG. 9B is a schematic cross-sectional view of the portion of FIG. 9A along line Y4-Y4 of FIG. 9A, while FIG. 9C and FIG. 9D are schematic cross-sectional views of the portion of FIG. 9B along line X3-X3 and line X4-X4 of FIG. 9B, respectively.

In the high density flexible wiring connection device 1 of the present embodiment, similarly as in the first embodiment, the FFC 2 has parallel conductors 21 formed at a narrow pitch on a flat plane. The conductors 21 are electrically connected to contact terminals 68, 67 of the FC connector 5, which is a cable connector having a double-sided contact designed for narrow-pitch wiring. The flexible wiring connection device 1 has a flexible contact member 2a (as another example of the supplementary wiring board) which is connected to the FFC 2, and which has wiring terminals 23, 24a on upper and lower surfaces thereof. The wiring terminals 23 on the upper surface of the contact member 2a are press-contacted to the contact terminals 68, while the wiring terminals 24a on the lower surface of the contact member 2a are press-contacted to the contact terminals 67.

Adjacent ones of the narrow-pitch conductors 21 of the FFC 2 are alternately connected to the wiring terminals 23, as a set, on the upper surface and the wiring terminals 24a, as a set, on the lower surface of the contact member 2a, respectively, so that each of the set of the wiring terminals 23 and set of the wiring terminals 24a on the upper and lower surfaces of the contact member 2a has an inter-terminal distance (i.e. pitch) which is twice as large as an inter-conductor distance (i.e. pitch) of the narrow-pitch conductors 21, similarly as in the first embodiment. This will be described in detail below.

Referring to FIG. 9A to FIG. 9D, the high density flexible wiring connection device 1 has an insulating base plate 25 made of a dielectric material. The insulating base plate 25 at a portion thereof corresponding to the FFC 2 has an upper surface provided with narrow-pitch conductors 21 formed thereon at a narrow pitch of 0.5 mm and covered with an insulating resin 22c. The insulating base plate 25 at a portion thereof corresponding to the contact member 2a has an upper surface provided with wide-pitch wiring terminals 23 formed thereon at a wide pitch of 1.0 mm, to which alternate ones (first alternate ones) of the conductors 21 are connected or contiguous. Furthermore, the insulating base plate 25 at the portion thereof corresponding to the contact member 2a has a lower surface provided with wide-pitch wiring terminals 24a formed thereon also at a wide pitch of 1.0 mm, to which the other alternate ones (second alternate ones) of the conductors 21 are connected.

The wiring terminals 23 connected or contiguous to the first alternate ones of the conductors 21 can be formed by extending the first alternate ones of the conductors 21. On the other hand, the wiring terminals 24a can be connected to the second alternate ones of the conductors 21 by forming through-holes 27, each of which passes through an end of each of the second alternate ones of the conductors 21 and through the insulating base plate 25. In this way, the inter-terminal distance or pitch (d5) of each of a set of the wiring terminals 23 and a set of the wiring terminals 24a in the contact member 2a can be made twice as large as the inter-conductor distance or pitch (d1) of the narrow-pitch conductors 21 in the FFC 2.

Referring to FIG. 8 together with FIG. 7, the process of connecting the high density flexible wiring connection device 1 to the FC connector 5 is started by first inserting the contact member 2a of the flexible wiring connection device 1 into a lower insertion space 65a of the FC connector 5 in the direction of arrow B1. Thereafter, a pressure plate 72 of, a slider 7 is inserted into the lower insertion space 65a. The insertion of the pressure plate 72 causes a movable insulating plate 66 to be pressed down toward a lower wall 64 in the direction of arrow B2 so as to press-contact the wiring terminals 23, 24a on the upper and lower surfaces of the contact member 2a to the contact terminals 68 of the movable insulating plate 66 and the contact terminals 67 of the lower wall 64, thereby establishing firm contact therebetween.

Thus, similarly as in the first embodiment, only alternate ones (every other one) of the narrow-pitch contact terminals 68, 67 contact the wiring terminals 23, 24a of the contact member 2a, because the inter-terminal distance or pitch d5 (1.0 mm) of each of the set of the wiring terminals 23 and the set of the wiring terminals 24a is twice as large as the inter-conductor distance or pitch d1 (0.5 mm) of the narrow-pitch contact terminals 68, 67. Those contact terminals 68, 67, which do not contact the wiring terminals 23, 24a and thus do not receive external stresses, do not form whiskers, so that any two adjacent ones of the contact terminals 68, 67 do not consecutively form whiskers. This makes it possible to prevent whiskers from causing short-circuits between adjacent contact terminals 68 and between adjacent contact terminals 67 as well as short-circuits between adjacent wiring terminals 23 and between adjacent wiring terminals 24a.

As described in the foregoing, the high density flexible wiring connection device 1 according to the present embodiment is advantageous because the wide-pitch wiring terminals 23, 24a having an inter-terminal distance d5 twice as large as an inter-conductor distance d1 can be easily provided on the same insulating base plate 25 on which the FFC is formed. Accordingly, the high density flexible wiring connection device 1 makes it possible to easily prevent whiskers from causing short-circuits between adjacent ones of the contact terminals 68, 67 and wiring terminals 23, 24a, even if the whiskers are formed on alternate contact terminals 68 and alternate contact terminals 67 which are press-contacted to the wiring terminals 23 and wiring terminals 24a, respectively, as long as the gap distance d3 between adjacent facing sides of adjacent contact terminals 68, 67 is larger than 0.15 mm that is a maximum length of whiskers, if any, formed to grow on the contact terminals 68, 67. Furthermore, since the wide-pitch wiring terminals 23, 24a are not formed on a base plate separate from the FFC 2, but integrally formed on the same insulating base plate 25 (i.e. integrally formed with the FFC 2), the flexible wiring connection device 1 can be manufactured in a small size and at a low cost.

Figure 10:
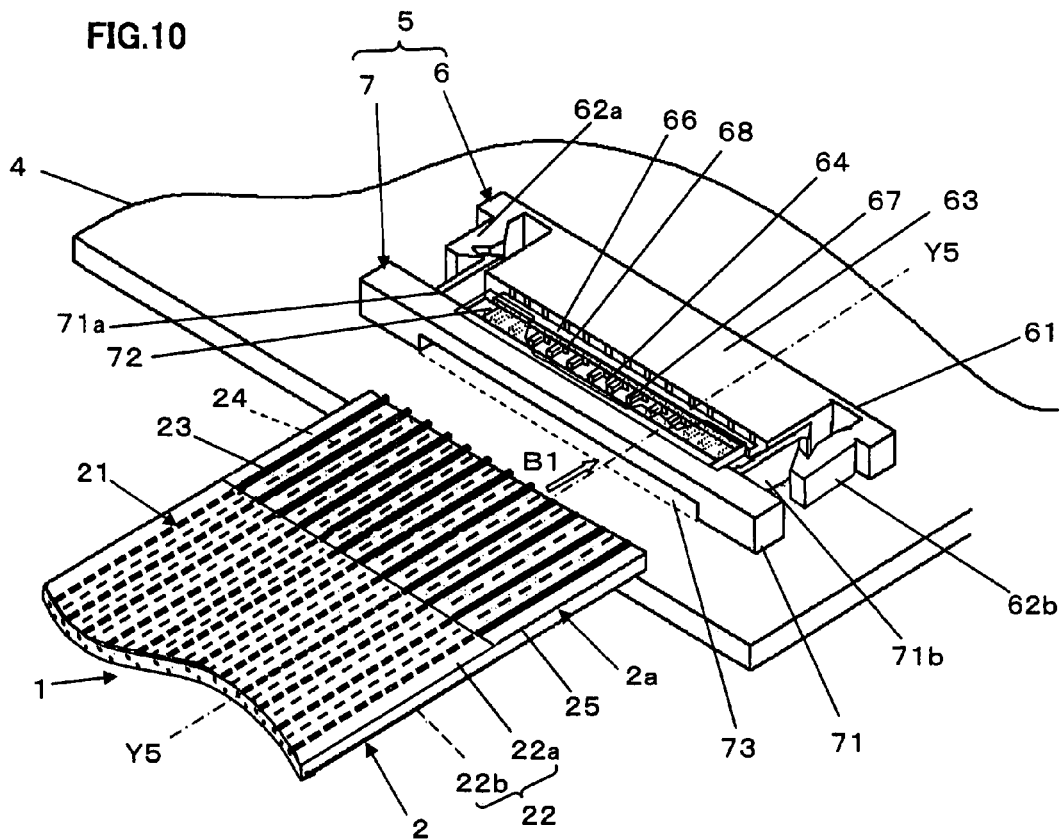
FIG. 10 is a schematic perspective view of a high density flexible wiring connection device according to a third embodiment of the present invention to be inserted into a flat cable connector.
Figure 11:
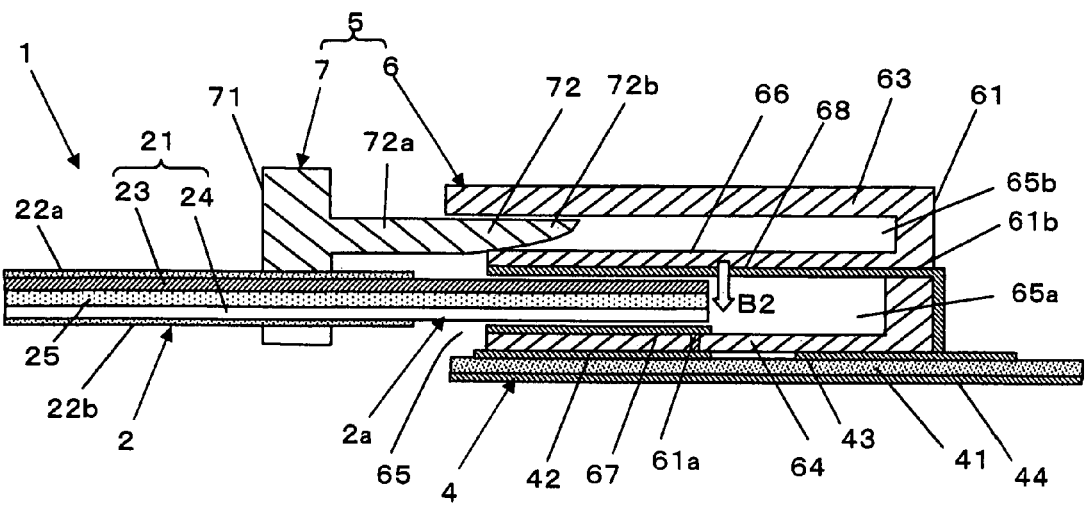
FIG. 11 is a schematic cross-sectional view of the flexible wiring connection device along line Y5-Y5 of FIG. 10.
Figure 12A:
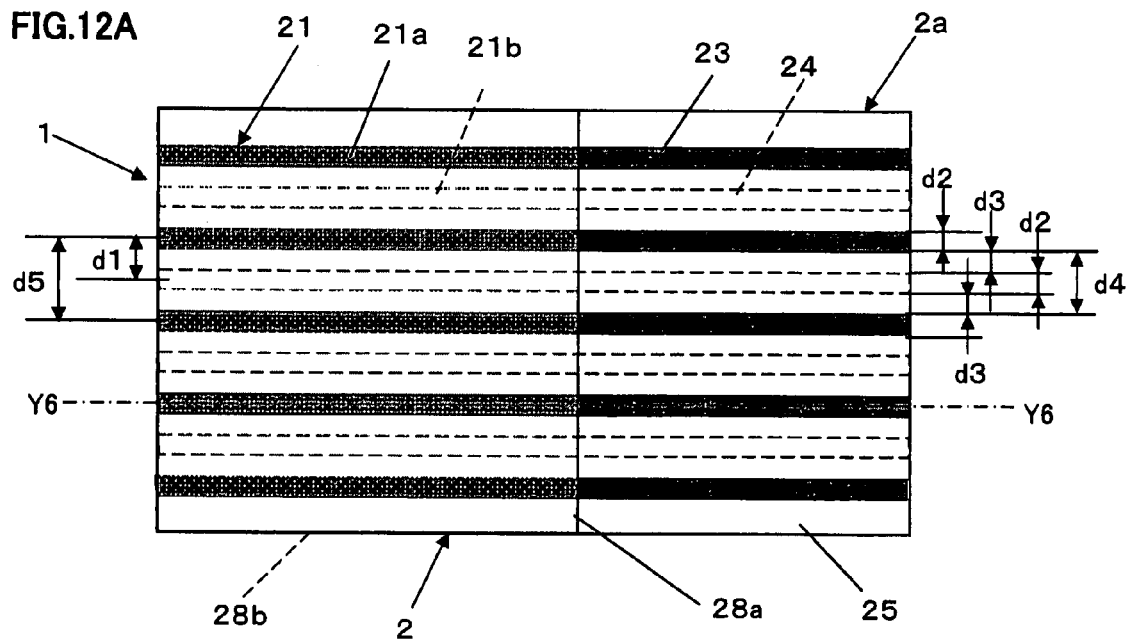
FIG. 12A is a schematic top plan view of an upper surface of a portion of the flexible wiring connection device which is a connecting portion between a contact member and a flexible flat cable.
Figure 12B:
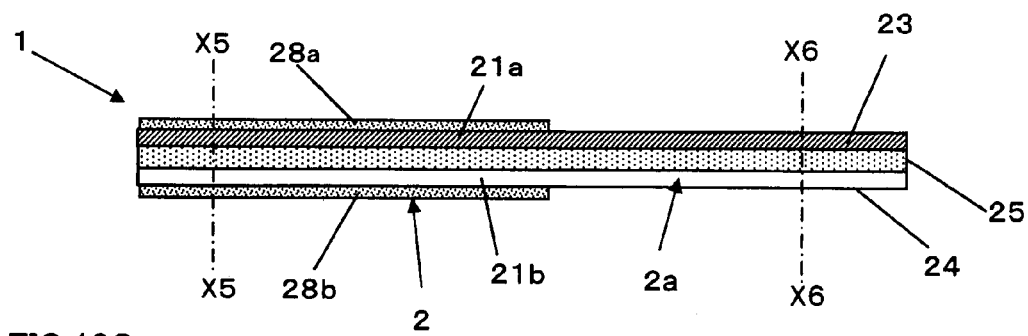
FIG. 12B is a schematic cross-sectional view of the portion of FIG. 12A along line Y6-Y6 of FIG. 12A.
Figure 12C:
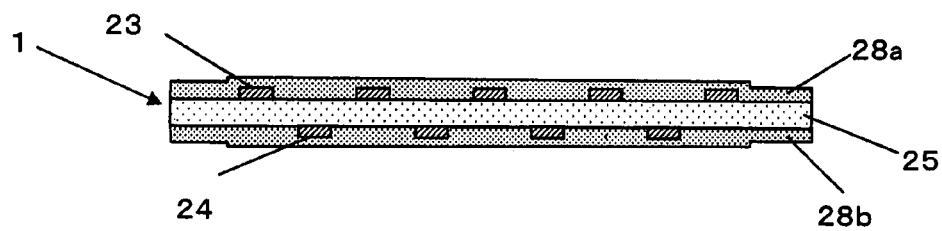
FIG. 12C and FIG. 12D are schematic cross-sectional views of the portion of FIG. 12B along line X5-X5 and line X6-X6 of FIG. 12B, respectively.
Figure 12D:
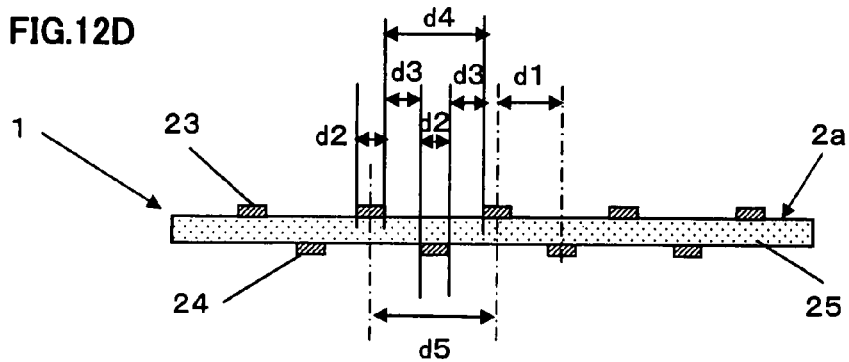

Referring now to FIG. 10, FIG. 11 and FIG. 12A to 12D, a high density flexible wiring connection device 1 according to a third embodiment of the present invention will be described. FIG. 10 is a schematic perspective View of a high density flexible wiring connection device 1 according to the third embodiment to be inserted into a flat cable connector (hereafter referred to as FC connector) 5, while FIG. 11 is a schematic cross-sectional view of the flexible wiring connection device 1 along line Y5-Y5 of FIG. 10. FIG. 12A is a schematic top plan view of an upper surface of a portion of the flexible wiring connection device 1, which is a connecting portion between a contact member 2*a* and a flexible flat cable (hereafter referred to as FFC) 2, and FIG. 12B is a schematic cross-sectional view of the portion of FIG. 12A along line Y6-Y6 of FIG. 12A, while FIG. 12C and FIG. 12D are schematic cross-sectional views of the portion of FIG. 12B along line X5-X5 and line X6-X6 of FIG. 12B, respectively.

The high density flexible wiring connection device 1 of the present embodiment has an FFC 2 and a flexible contact member 2*a* contiguous to the FFC 2. The FFC 2 has parallel conductors 21 formed on an upper surface of an insulating base plate 25 as a set of conductors 21*a* and formed on a lower surface of the insulating base plate 25 as a set of conductors 21*b*. When all the conductors 21 are seen in the plan view of FIG. 12A (namely seen vertically through the FFC 2 to recognize the positions of both conductors 21*a*, 21*b* at the same time in the plan view) in which the positions of the set of conductors 21*b* on the lower surface of the insulating base plate 25 are indicated by dashed lines, the set of conductors 21*a* and the set of conductors 21*b* are staggered and alternately positioned at a narrow pitch d1 of 0.5 mm. The set of conductors 21*a* and the set of conductors 21*b* of the FFC 2 are contiguous to a set of wiring terminals 23 on an upper surface of the contact member 2*a* and a set of wiring terminals 24 on a lower surface of the contact member 2*a*. Thus, each of the set of conductors 21*a* and set of conductors 21*b* has an inter-conductor distance (pitch) d5 the same as an inter-terminal distance (pitch) d5 which each of the set of wiring terminals 23 and set of wiring terminals 24 has, and which is twice the narrow pitch d1. The set of wiring terminals 23 and set of wiring terminals 24 are respectively connected to a set of contact terminals 68 and a set of conductors 67 of the FC connector 5, which is a cable connector having a double-sided contact for narrow-pitch wiring, as will be described in detail below.

Referring to FIG. 12A to FIG. 12D, the high density flexible wiring connection device 1 according to the present embodiment has an insulating base plate 25 made of a dielectric material. The insulating base plate 25 at a portion thereof corresponding to the FFC 2 has an upper surface provided with a set of wide-pitch conductors 21*a* formed thereon at a wide pitch d5 of 1.0 mm and covered with an insulating resin 28*a*, and also has a lower surface provided with a set of wide-pitch conductors 21*b* formed thereon at a wide pitch d5 of 1.0 mm and covered with an insulating resin 28*b*. The insulating base plate 25 at a portion thereof corresponding to the contact member 2*a* has an upper surface provided with a set of wide-pitch wiring terminals 23 formed thereon at a wide pitch d5 of 1.0 mm, and also has a lower surface provided with a set of wide-pitch wiring terminals 24 at a wide pitch d5 of 1.0 mm.

The set of conductors 21*a* are contiguous or connected to the set of wiring terminals 23, and the set of conductors 21*b* are contiguous to the set of wiring terminals 24. The set of wiring terminals 23 and set of wiring terminals 24 can be formed simply by extending the set of conductors 21*a* and set of conductors 21*b*, respectively. Thus, it can be said that the sets of wiring terminals 23, 24 are portions of the conductors 21*a*, 21*b*, respectively, which are provided on and over the entire length of the insulating base plate 25 (hence entire length of the FFC 2 or even the flexible wiring connection device 1), and which have a wide pitch d5 of 1.0 mm twice the narrow pitch d1 of 0.5 mm when all the conductors 21*a*, 21*b* and wiring terminals 23, 24 on the upper and lower surfaces of the insulating base plate 25 (FFC 2 and contact member 2*a*) are seen in the plan view of FIG. 12A.

Referring to FIG. 11 together with FIG. 10, the process of connecting the high density flexible wiring connection device 1 to the FC connector 5 is started by first inserting the contact member 2*a* of the flexible wiring connection device 1 into a lower insertion space 65*a* of the FC connector 5 through a gap 73 between a printed circuit board 4 and a slider body 71 of a slider 7 in the FC connector 5 in the direction of arrow B1. Thereafter, a pressure plate 72 of the slider 7 is inserted into the lower insertion space 65*a*. The insertion of the pressure plate 72 causes a movable insulating plate 66 to be pressed down toward a lower wall 64 in the direction of arrow B2 so as to press-contact the wiring terminals 23, 24 on the upper and lower surfaces of the contact member 2*a* to the contact terminals 68 of the movable insulating plate 66 and the contact terminals 67 of the lower wall 64, thereby establishing firm contact therebetween.

Thus, as shown in FIG. 12A to FIG. 12D, the high density flexible wiring connection device 1 according to the present embodiment has the set of conductors 21*a*, 21*b* and hence the set of wiring terminals 23, 24 on and over the entire length of the upper and lower surfaces of the insulating base plate 25, in which the set of conductors 21*a* and hence the set of wiring terminals 23 having a wide pitch d5 are staggered and alternately intervened with respect to the set of conductors 21*b* and hence the set of wiring terminals 24 also having the wide pitch d5 as seen in the plan view of FIG. 12A. Accordingly, the wide pitch d5 is twice as large as the narrow pitch d1 of all the conductors 21*a*, 21*b* and hence the wiring terminals 23, 24 as staggered and alternately intervened with each other are seen in the plan view of FIG. 12A.

Thus, similarly as in the first and second embodiments, only alternate ones (every other one) of the narrow-pitch contact terminals 68, 67 contact the wiring terminals 23, 24 of the contact member 2*a*. Those contact terminals 68, 67, which do not contact the wiring terminals 23, 24 and thus do not receive external stresses, do not form whiskers, so that any two adjacent ones of the contact terminals 68, 67 do not consecutively form whiskers. This makes it possible to prevent whiskers from causing short-circuits between adjacent contact terminals 68 and between adjacent contact terminals 67 as well as short-circuits between adjacent wiring terminals 23 and between adjacent wiring terminals 24.

As described in the foregoing, the high density flexible wiring connection device 1 according to the present embodiment is advantageous because the wide pitch d5 of the set of conductors 21*a* and hence wiring terminals 23 as well as the set of conductors 21*b* and hence wiring terminals 24 on and over the entire length of the FFC 2 with the contact member 2*a* or the high density flexible wiring connection device 1 is twice as large as the pitch d1 of the narrow pitch d1 of all the conductors 21*a*, 21*b* and hence the wiring terminals 23, 24 as staggered and alternately intervened with each other are seen in the plan view of FIG. 12A. Accordingly, it is not necessary to convert the pitch of the conductors 21*a*, 21*b* on the FFC 2 to a wider pitch, so that the wide-pitch wiring terminals 23, 24 as contiguous portions of the wide-pitch conductors 21*a*, 21*b*, as is, can be connected to the FC connector 5 (more specifically-to the contact terminals 68, 67).

Thus, adjacent ones of the contact terminals 68 of the FC connector 5 do not contact the wiring terminals 23 of the FFC 2 or flexible wiring connection device 1. Further, adjacent ones of the contact terminals 67 of the FC connector 5 do not contact the wiring terminals 24 of the FFC 2 or flexible wiring connection device 1. Accordingly, the high density flexible wiring connection device 1 makes it possible to easily prevent whiskers from causing short-circuits between adjacent ones of the contact terminals 68, 67 and wiring terminals 23, 24, even if the whiskers are formed on alternate contact terminals 68 and alternate contact terminals 67 which are press-contacted to the wiring terminals 23 and wiring terminals 24, respectively, as long as the gap distance d3 between adjacent facing sides of adjacent contact terminals 68, 67 is larger than 0.15 mm that is a maximum length of whiskers, if any, formed to grow on the contact terminals 68, 67.

Figure 13:
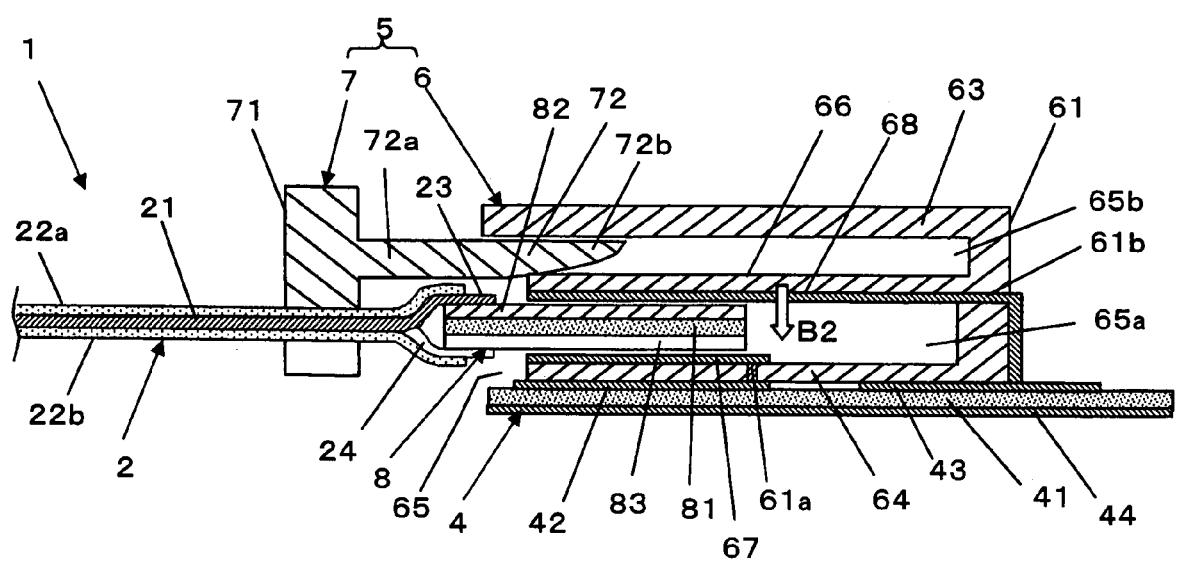
FIG. 13 is a schematic cross-sectional view, similar to FIG. 2, of a high density flexible wiring connection device according to a fourth embodiment of the present invention to be inserted into a flat cable connector.
Figure 14A:
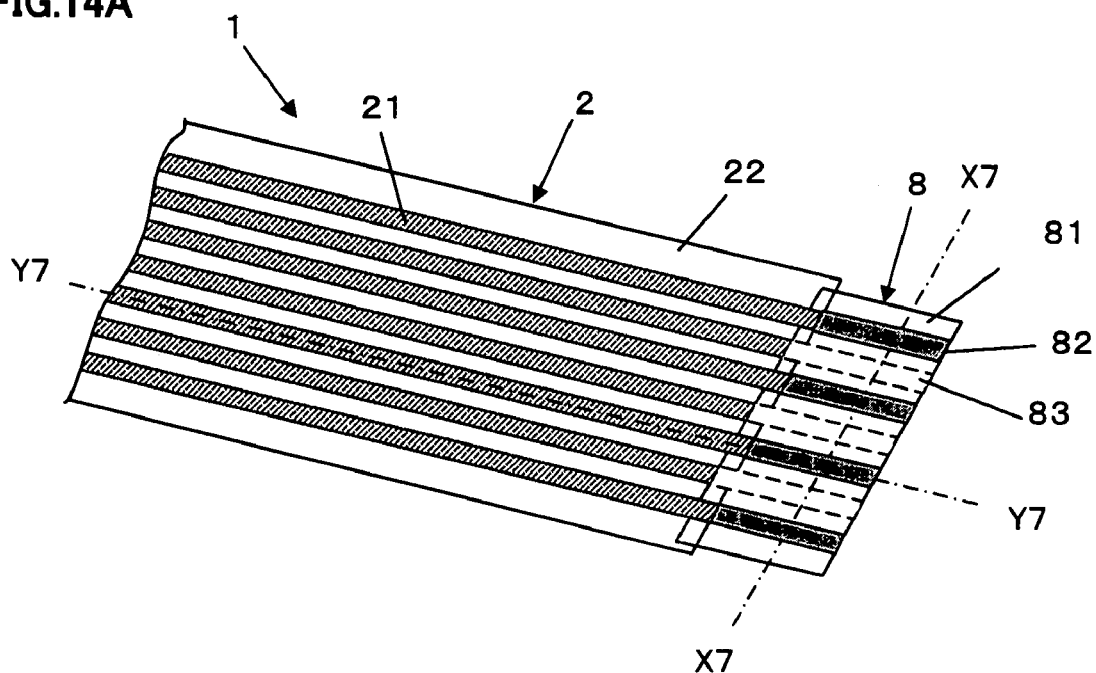
FIG. 14A is a schematic perspective view of an upper surface of a portion of the flexible wiring connection device which is a connecting portion between a flexible flat cable and a supplementary wiring board.
Figure 14B:
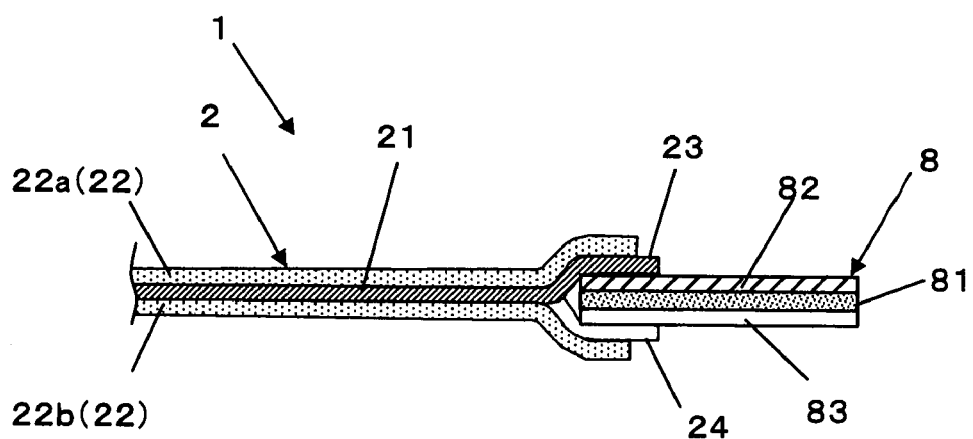
FIG. 14B is a schematic cross-sectional view of the portion of FIG. 14A along line Y7-Y7.
Figure 14C:
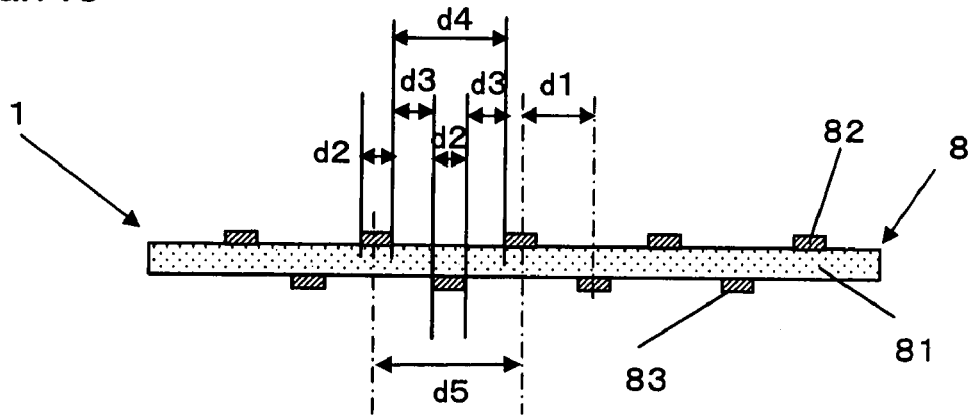
FIG. 14C is a schematic cross-sectional view of the portion of FIG. 14A along line X7-X7.

Referring now to FIG. 13 and FIG. 14A to 14C, a high density flexible wiring connection device 1 according to a fourth embodiment of the present invention will be described. FIG. 13 is a schematic cross-sectional view, similar to FIG. 2, of a high density flexible wiring connection device 1 according to the fourth embodiment of the present invention to be inserted into a flat cable connector (hereafter referred to as FC connector) 5. FIG. 14A is a schematic perspective view of an upper surface of a portion of the flexible wiring connection device 1, which is a connecting portion between a flexible flat cable (hereafter referred to as FFC) 2 and a supplementary wiring board 8, and FIG. 14B is a schematic cross-sectional view of the portion of FIG. 14A along line Y7-Y7, while FIG. 14C is a schematic cross-sectional view of the portion of FIG. 14A along line X7-X7.

In the high density flexible, wiring connection device 1 of the present embodiment, similarly as in the first and second embodiments, the FFC 2 has parallel conductors 21 formed at a narrow pitch on a flat plane. The conductors 21 are electrically connected to contact terminals 68, 67 of the FC connector 5, which is a cable connector having a double-sided contact designed for narrow-pitch wiring. The flexible wiring connection device 1 has a supplementary wiring board 8 which is connected to the FFC 2, and which has wiring terminals 82, 83 on upper and lower surfaces thereof. The wiring terminals 82 on the upper surface of the supplementary wiring board 8 are press-contacted to the contact terminals 68, while the wiring terminals 83 on the lower surface of the supplementary wiring board 8 are press-contacted to the contact terminals 67.

Adjacent ones of the narrow-pitch conductors 21 of the FFC 2 are alternately connected to the wiring terminals 82, as a set, on the upper surface and the wiring terminals 83, as a set, on the lower surface of the supplementary wiring board 8, respectively, so that each of the set of the wiring terminals 82 and the set of the wiring terminals 83 on the upper and lower surfaces of the supplementary wiring board 8 has an inter-terminal distance (i.e. pitch) which is twice as large as an inter-conductor distance. (i.e. pitch) of the narrow-pitch conductors 21, similarly as in the first and second embodiments. This will be described in detail below.

Referring to FIG. 14A to FIG. 14C together with FIG. 13, the high density flexible wiring connection device 1 according to the present embodiment comprises: an FFC 2 having parallel conductors 21 formed at a narrow pitch of 0.5 mm on a flat plane in an insulating resin cover 22; and a flexible supplementary wiring board 8 having parallel wiring terminals 82, 83 formed on flat upper and lower surfaces of a flexible insulating resin plate 81, respectively. The supplementary wiring board 8 is connected to a flat cable connector (hereafter referred to as FC connector) 5 having a double-sided contact designed for narrow-pitch wiring, such that the wiring terminals 82, 83 of the supplementary wiring board 8 are connected to contact terminals 68, 67 of the FC connector 5. In the FFC 2, the narrow-pitch conductors 21 are placed in the insulating resin cover 22, such that adjacent ones of the conductors 21 are spaced from each other at a predetermined distance so as to be insulated from each other. The insulating resin cover 22 has upper and lower flexible insulating resin cover halves 22a, 22b to firmly sandwich the conductors 21, thereby forming the FFC 2. The insulating resin cover 22 has a thickness of 1.0 mm or smaller so as to allow the FFC 2 to have flexibility.

More specifically, as shown in FIG. 14A to FIG. 14C together with FIG. 13, the flexible supplementary wiring board 8 to be electrically connected to the contact terminals 68, 67 of the insulating housing 6 has the narrow-pitch conductors 21 alternately bent oppositely (upward and downward) and placed on end portions of the upper and lower surfaces of the insulating resin plate 81 thereof, respectively. Thereby, the extensions or portions of the conductors 21 on the end portions of the upper and lower surface of the insulating resin plate 81 are connected to the wiring terminals 82, 83 on the insulating resin plate 81, respectively. Assuming that the narrow-pitch conductors 21 have an inter-conductor distance d1 (i.e. center-to-center distance between adjacent conductors 21 or pitch of conductors 21) of 0.5 mm, each of the set of wiring terminals 82 and set of wiring terminals 83 in the supplementary wiring board 8 has an inter-terminal distance d5 (i.e. center-to-center distance between adjacent wiring terminals 82 and between adjacent wiring terminals 83 or pitch of wiring terminals 82, 83) of 1.0 mm, which is twice as large as d1. Thus, the sets of wiring terminals 82, 83 of the supplementary wiring board 8 can be referred to as wide-pitch wiring terminals, similarly as in the preceding embodiments such as shown in FIG. 3A and FIG. 3B together with FIG. 6.

As shown in FIG. 14A to FIG. 14C together with FIG. 13, similarly as in e.g. the first and second embodiments, only alternate ones (every other one) of the narrow-pitch contact terminals 68, 67 of the FC connector 5 contact the wide-pitch wiring terminals 82, 83 of the supplementary wiring board 8. This makes it possible to prevent whiskers from causing short-circuits between adjacent contact terminals 68 and between adjacent contact terminals 67 as well as short-circuits between adjacent wiring terminals 82 and between adjacent wiring terminals 83, even if the whiskers are formed on alternate contact terminals 68 and alternate contact terminals 67 which are press-contacted to the wiring terminals 82 and wiring terminals 83, respectively, similarly as in the preceding embodiments, as long as the gap distance d3 between adjacent facing sides of adjacent contact terminals 68, 67 is larger than 0.15 mm that is a maximum length of whiskers, if any, formed to grow on the contact terminals 68, 67.

As described in the foregoing, the high density flexible wiring connection device 1 according to the present embodiment uses a supplementary wiring board 8 to make it possible to provide wide-pitch wiring terminals 82, 83 having a pitch d5 which is twice as large as the pitch d1 of the narrow-pitch conductors of the FFC 2. Accordingly, the high density flexible wiring connection device 1 can prevent the affect of whiskers or prevent whiskers from causing short-circuits. Further, since the supplementary wiring board 8 used here is prepared separately from the FFC 2, it is possible to modify, if necessary, the design of the wirings 82, 83 per se on the supplementary wiring board 8 without being substantially affected by modifications, if any, of the design of the FFC 2, thereby facilitating and increasing the degree of freedom of the design of the supplementary wiring board 8. The supplementary wiring board 8 can be separately manufactured, so that it is easy to manufacture it. Since the prevention of the affect of whiskers in electrically connecting the narrow-pitch FFC 2 and the FC connector 5 can be achieved only by designing the supplementary wiring board 8 without requiring a change in the design of the FFC 2, it is possible to use an FFC 2 with a conventional design for electrical connection.

It is apparent from the foregoing that the high density flexible wring connection device 1 according to any of the above embodiments uses an FFC 2 having parallel conductors 21 which are formed at a narrow pitch or inter-conductor distance of d1 (0.5 mm) on a flat plane, and which are to be electrically connected to contact terminals 68, 67 of a FC connector 5 having a double-sided contact designed also for narrow-pitch wiring. A feature common to all the embodiments is that wiring terminals 23, 24 (24a) or 82, 83 are provided on upper and lower surfaces of a supplementary wiring board (supplementary wiring board 3 or 8, or contact member 2a) to connect the FFC 2 and the FC connector 5, and that one ends of the wiring terminals 23 or 82 are connected to alternate ones of the conductors 21, and one ends of the wiring terminals 24 (24a) or 83 are connected to the other alternate ones of the conductors 21, while the other ends of the wiring terminals 23 or 82 are connected to the contact terminals 68 of the FC connector 5, and the other ends of the wiring terminals 24 (24a) or 83 are connected to the contact terminals 67 of the FC connector 5.

Thereby, the wiring terminals 23, 24 (24a), 82, 83 can have a wide pitch or inter-terminal distance of d5 (1.0 mm) which is twice as large as the narrow pitch d5 of the conductors 21 (or contact terminals 68, 67). This makes it possible to prevent whiskers from causing short-circuits between adjacent contact terminals 68 and between adjacent contact terminals 67 as well as short-circuits between adjacent wiring terminals 23 or 82 and between adjacent wiring terminals 24 (24a) or 83, even if the whiskers are formed on alternate contact terminals 68 and alternate contact terminals 67 which are press-contacted to the wiring terminals 23 or 82 and wiring terminals 24 (24a) or 83, respectively, as long as the gap distance d3 between adjacent facing sides of adjacent contact terminals 68, 67 is larger than 0.15 mm that is a maximum length of whiskers, if any, formed to grow on the contact terminals 68, 67. Thus, a high density flexible wiring connection device 1 with high reliability can be obtained.

It is to be noted that the present invention is not limited to the above embodiments, and various modifications are possible within the spirit and scope of the present invention. For example, the high density flexible wiring connection device 1 can use an FPC (flexible printed circuit board) in place of the FFC (flexible flat cable) used in the above embodiments. Similarly as in the case of using an FFC, the flexible wiring connection device according to the present invention using an FPC can prevent the affect of whiskers or prevent whiskers from causing short-circuits by providing wide-pitch wiring terminals between the FPC and an FC connector.

The present invention has been described above using presently preferred embodiments, but such description should not be interpreted as limiting the present invention. Various modifications will become obvious, evident or apparent to those ordinarily skilled in the art, who have read the description. Accordingly, the appended claims should be interpreted to cover all modifications and alterations which fall within the spirit and scope of the present invention.

What is claimed is:

1. A high density flexible wiring connection device comprising:
    a flexible flat cable having narrow-pitch parallel conductors;
    a flat cable connector having a double-sided contact designed for narrow-pitch wiring and having upper and lower contact terminals to be electrically connected to the narrow-pitch conductors of the flexible flat cable, the flat cable connector being mounted on a printed circuit board; and
    a supplementary wiring board having upper wiring terminals and lower wiring terminals provided on upper and lower surfaces thereof for connecting the flexible flat cable and the flat cable connector, such that one end of the upper wiring terminals of the supplementary wiring board are connected to alternate ones of the narrow-pitch conductors, and one end of the lower wiring terminals of the supplementary wiring board are connected to the other alternate ones of the narrow-pitch conductors, while the other ends of the upper wiring terminals of the supplementary wiring board are connected to alternate ones of the upper contact terminals of the flat cable connector, and the other ends of the lower wiring terminals of the supplementary wiring board are connected to alternate ones of the lower contact terminals of the flat cable connector, whereby the upper wiring terminals as well as the lower wiring terminals of the supplementary wiring board have a wide pitch twice as large as the narrow pitch of the narrow-pitch conductors, thereby preventing whiskers from causing short-circuits between adjacent ones of the upper contact terminals and between adjacent ones of the lower contact terminals of the flat cable connector.

2. The high density flexible wiring connection device according to claim 1, wherein the alternate ones of the narrow-pitch conductors are provided at the wide pitch twice as large as the narrow pitch on and over entire length of the upper surface of the flexible flat cable, and are contiguous to the upper wiring terminals provided at the wide pitch twice as large as the narrow pitch on and over entire length of the upper surface of the supplementary wiring board, while the other alternate ones of the narrow-pitch conductors are provided at the wide pitch twice as large as the narrow pitch on and over entire length of the lower surface of the flexible flat cable, and are contiguous to the lower wiring terminals provided at the wide pitch twice as large as the narrow pitch on and over entire length of the lower surface of the supplementary wiring board, such the alternate ones of the narrow-pitch conductors and the upper wiring terminals are staggered and alternately intervened with respect to the other alternate ones of the narrow-pitch conductors and the lower wiring terminals, respectively.

3. The high density flexible wiring connection device according to claim 1, wherein all the narrow-pitch conductors of the flexible flat cable are formed at the narrow pitch on a flat plane in the supplementary wiring board.

4. The high density flexible wiring connection device according to claim 1, wherein adjacent ones of the contact terminals has a gap distance larger than 0.15 mm.

5. The high density flexible wiring connection device according to claim 4, wherein the narrow pitch of the contact terminals of the flat cable connector is 0.5 mm.

* * * * *